(12) United States Patent
Birkbeck (10) Patent No.: US 7,372,332 B2
(45) Date of Patent: May 13, 2008

(54) OPTIMIZING POWER CONSUMPTION IN AMPLIFIERS

(75) Inventor: John David Birkbeck, New Milton (GB)

(73) Assignee: Roke Manor Research Limited, Romsey (GB)

( * ) Notice: Subject to any disclaimer, the term of this patent is extended or adjusted under 35 U.S.C. 154(b) by 204 days.

(21) Appl. No.: 10/508,120

(22) PCT Filed: Mar. 20, 2003

(86) PCT No.: PCT/GB03/01309

§ 371 (c)(1), (2), (4) Date: May 3, 2005

(87) PCT Pub. No.: WO03/081772

PCT Pub. Date: Oct. 2, 2003

(65) Prior Publication Data

US 2005/0218992 A1    Oct. 6, 2005

(30) Foreign Application Priority Data

| Mar. 20, 2002 | (GB) | ................................. 0206571.2 |
| Aug. 15, 2002 | (GB) | ................................. 0218920.7 |
| Feb. 24, 2003 | (GB) | ................................. 0304053.2 |

(51) Int. Cl.
*H03F 3/04* (2006.01)

(52) U.S. Cl. ...................................... 330/296

(58) Field of Classification Search ..................... None
See application file for complete search history.

(56) References Cited

U.S. PATENT DOCUMENTS

| 5,270,882 | A | * | 12/1993 | Jove et al. ..................... 360/67 |
| 6,122,532 | A | * | 9/2000 | Taylor ......................... 455/574 |
| 6,300,837 | B1 | | 10/2001 | Sowlati et al. |
| 6,369,657 | B2 | * | 4/2002 | Dening et al. ............... 330/296 |
| 6,404,287 | B2 | * | 6/2002 | Dening et al. ............... 330/296 |
| 6,433,641 | B1 | * | 8/2002 | Sakuno ........................ 330/296 |
| 6,566,954 | B2 | * | 5/2003 | Miyazawa ................... 330/285 |
| 6,680,652 | B2 | * | 1/2004 | Hoheisel et al. ............ 330/302 |
| 6,750,718 | B2 | * | 6/2004 | Moriwaki et al. .......... 330/285 |
| 6,753,734 | B2 | * | 6/2004 | Arell et al. .................. 330/296 |
| 6,778,018 | B2 | * | 8/2004 | Joly et al. .................... 330/296 |
| 6,784,748 | B1 | * | 8/2004 | Canyon et al. ............. 330/296 |
| 6,806,774 | B2 | * | 10/2004 | Sakuno ........................ 330/296 |
| 6,831,517 | B1 | * | 12/2004 | Hedberg et al. ............ 330/285 |
| 7,064,614 | B2 | * | 6/2006 | Feng et al. .................. 330/296 |
| 7,091,790 | B2 | * | 8/2006 | Doherty et al. ............. 330/297 |
| 7,129,786 | B2 | * | 10/2006 | Kim et al. ................... 330/297 |

FOREIGN PATENT DOCUMENTS

| EP | 0 488 385 A | 6/1992 |
| EP | 0 987 817 A | 3/2000 |
| EP | 1410499 A0 | 4/2004 |
| GB | 2269502 A | 2/1994 |
| WO | 03/010855 A1 | 2/2003 |

* cited by examiner

*Primary Examiner*—Benny Lee
*Assistant Examiner*—Krista M Flanagan
(74) *Attorney, Agent, or Firm*—Crowell & Moring LLP (57) ABSTRACT

The present invention provides methods and apparatus for optimising power consumption in transistor amplifiers. The method comprises the step of adapting the amplifier characteristics of the transistor by adapting the bias impedance at the base of the transistor. The method may further comprise the step of adapting the amplifier characteristics of the transistor by adapting the quiescent collector current in the transistor.

17 Claims, 9 Drawing Sheets

OPTIMIZING POWER CONSUMPTION IN AMPLIFIERS

The present invention relates to methods and apparatus for optimising the power consumption of amplifiers, whilst maintaining adequate signal linearity. In particular, the present invention relates to methods and apparatus for optimising power consumption of RF amplifiers for use in mobile telephone handsets, but may be applied to other types of amplifier and other types of equipment, particularly battery powered equipment.

Mobile telephone handsets are called upon to operate in several different modes, for example according to the availability of service, or the proximity of the assigned base station. For example, a hand set near the edge of a cell may have to transmit at a relatively high power in order for its signal to be received sufficiently clearly at the base station. Conversely, it would be wasteful to have the handset operating at high power when within close range of the base station. Mobile telephone handsets may be called upon to operate according to a variety of modes. For example, a CDMA mode requires quite strict linearity in RF amplification, while an AMPS mode is less sensitive to non-linearity.

Since a mobile telephone is powered by a portable battery, it is important to minimise power consumption in order to maximise the useful operating life of the handset between recharging of the battery. It is also important to provide usable telephone service at as many geographical locations as possible. When the handset is close to a base station, only a relatively low transmission power is required to enable communication between the handset and the base station. When the handset is further from the base station, or in a region of interference or lossy transmission path, a much higher transmission power is required, to provide communication. Of course, a mobile telephone handset could be arranged to transmit at full power at all times. However, this would result in much reduced autonomy for the handset, requiring battery recharging at frequent intervals, and would introduce an unacceptable level of noise into the transmission environment.

The present invention provides a method and apparatus for adjusting the operating parameters of an amplifier, such as an RF amplifier for a mobile telephone, to achieve an improved efficiency according to the required mode of operation of the amplifier.

Accordingly, the present invention provides methods and apparatus as recited in the appended claims.

The above, and further, objects, characteristics and advantages will become more clear with reference to the following description of certain embodiments thereof, in conjunction with the accompanying drawings, wherein.

Features common with those illustrated in other drawings carry corresponding reference labels.

Figure 1:
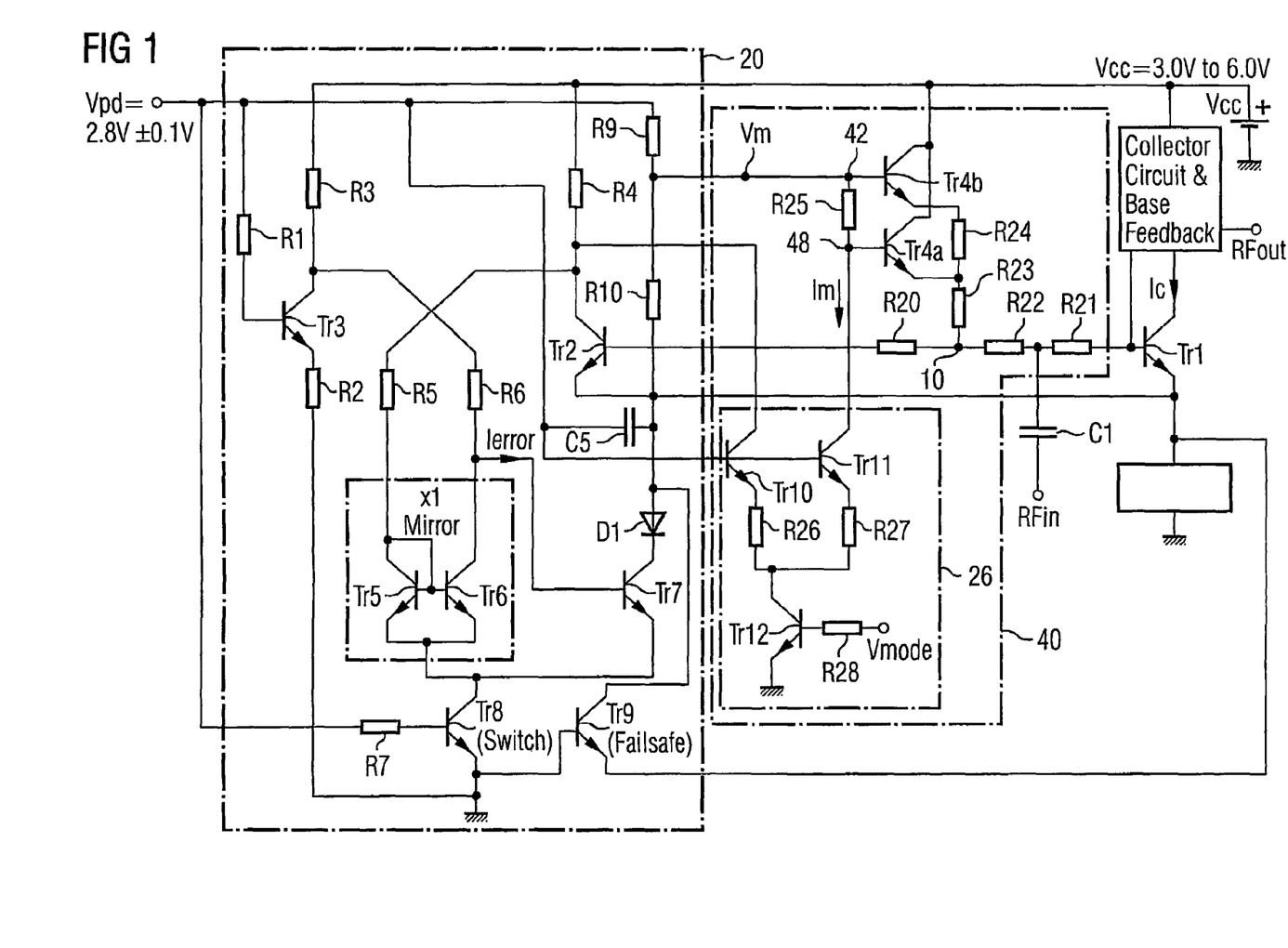
FIG. 1 shows a circuit diagram of a practical dual mode power amplifier circuit according to an embodiment of the present invention.

The maximum available output power from a transistor amplifier is a function of, amongst other things, the supply current available, for example shows as collector current Ic in FIG. 1. In an amplifier configuration which includes a self biasing mechanism, such that Ic increases with increased RF drive level, then the parameters of the self biasing mechanism ultimately limit the maximum output power. In such a case, an "input bias resistance" or bias circuit impedance can be identified, which limits the available output power that can be achieved at a given linearity. For example, a relatively high input bias resistance tends to lead to a very non-linear amplification, but with excellent efficiency; whereas a lower input bias resistance will lead to more linear amplification but with a lesser efficiency. Specifically, for different power and linearity requirements, different bias resistances are required if amplifier efficiency is to be optimised.

According to the present invention, the bias circuit impedance of an amplifier can be adjusted by switching in or out certain resistors of a provided series resistor chain. In certain embodiments, this switching function is achieved by controlling emitter follower transistors having various associated combinations of resistors.

Although the present invention does not aim to provide a truly variable bias impedance, the present invention does at least provide an approximation of this function. In particular, circuits suitable for use in mobile telephone handsets are provided, which offer both low and high power modes of operation. The low power mode is suitable for efficient amplification of signals to a modest power level where linearity must be maintained, for example with CDMA encoding, or for highly efficient amplification of signals to a high power level, albeit in a very non-linear manner, as for example may be required with AMPS type encoding. The high power mode provides efficient amplification of signals to a higher power level where linearity must be maintained, again using CDMA encoding for example.

FIG. 1 illustrates a type of amplifier modified according to an embodiment of the present invention. The basic amplifier upon which the embodiment of FIG. 1 is based is described and illustrated in UK patent application No. 0304053.2, from which the present application claims priority, and the corresponding International patent application No. PCT/GB2003/001309, filed 20 Mar. 2003. In summary, the amplifier operates as follows.

In the absence of an RF signal, the control loop 20 operates to provide a voltage Vm necessary to set the quiescent current Ic in transistor Tr1 to a predetermined value. In this case, the quiescent levels can be set, depending on the voltage at the switch control terminal Vmode. This Vmode control voltage also operates to simultaneously switch the bias current impedance between two corresponding values. These values are either a low impedance, which may for simplicity be considered to be the sum of the resistances of resistors R23 and R22, or a high impedance, which may for simplicity be considered to be the sum of the resistances of resistors R24, R23 and R22. The low bias impedance is provided with a high quiescent current Ic as a high power mode. The high bias impedance is provided with a low quiescent current Ic as a low power mode. A more detailed description of the operation of this circuit will be provided later.

The present invention relates to the mode control and bias impedance variation circuitry 40, described in UK patent application No. 0304053.2.

As will be further described, and according to an aspect of the present invention, a mode signal Vmode may be provided to control the operation of the amplifier, selecting either a high power mode of operation or a low power mode of operation, as described earlier.

In the absence of an input signal RFin, the control loop 20 will fix the quiescent collector current in Tr1 to a certain constant value, whatever the values of the resistors in the base circuit. When an input signal is applied, a self-biasing effect may occur. The present invention aims, amongst other things, to compromise between providing only a low quiescent collector current in Tr1, while still permitting relatively high powered output amplified signals RFout, thus optimising efficiency for a given signal linearity requirement.

The present invention is also applicable to other topologies where a self-biasing mechanism is provided, based on a gain element such as emitter follower transistor Tr4, but where the Vm signal is developed by alternative means, such as by monitoring Ic directly, for example. In such a case the current mirror transistor Tr2 would not be required, and the power amplifying transistor Tr1 has its base terminal connected through resistors R21, R22 and R23 to the resistor R24. Resistors R22 and R23 may be merged into a single resistor.

Depending on the layout strategy used, large transistor Tr1 may be made up of N smaller transistors, connected in parallel and each with its own independent RF base feed capacitor Cb and DC base feed resistor Rb. The N transistors, capacitors and resistors are in this case represented lumped together in FIG. 4 as C1=Cb*N and R22=Rb/N.

Figure 2:
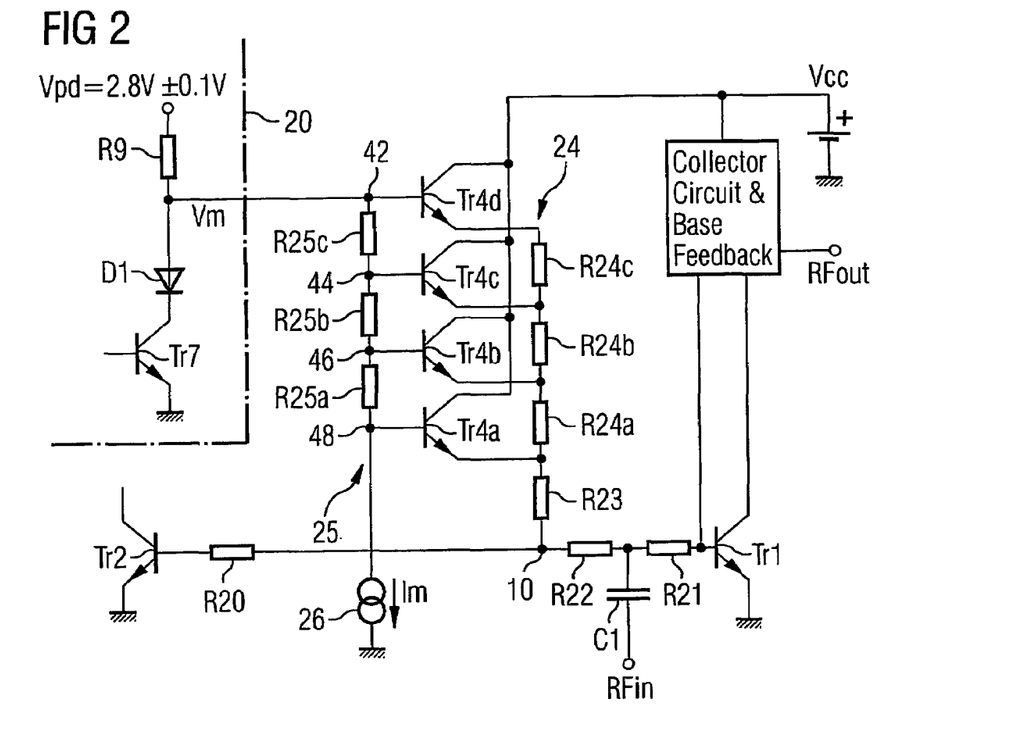
FIG. 2 shows a generalised circuit diagram of an embodiment of the present invention according to a first realisation of the present invention.

FIG. 2 shows a generalised form of this first ('vertical') realisation of the present invention. A current mirror comprising transistors Tr1 and Tr2 is provided, with resistors R20, R21 and R22 in series, connecting their base terminals. A capacitor C1 is connected to the node between resistors R21, R22 and introduces the signal to be amplified. In an example of an amplifier for a mobile telephone handset, the signal may be an RF signal for transmission. The DC quiescent point of operation of the amplifier is set by the current flowing through resistors R23, R22 and R21, and circuit operation is further determined by the state of conduction of the transistors Tr4a-Tr4d. Although four transistors are shown, more or fewer could be provided, according to the number of different bias resistance values it is required to provide. Each of the emitter follower transistors Tr4a-Tr4d may be provided with a base resistor connecting its base terminal to the corresponding node on the chain of resistors R25; R25c-R25a, in order to fine tune the self-bias profile of the amplifier.

A voltage signal Vm is derived from a signal voltage Vpd and is provided as an input signal by a control circuit symbolically indicated by transistor Tr7 and diode D1. Such a control circuit may be as shown at reference 20 in FIG. 1, wherein transistor Tr7 and diode D1 may be identified. For the purposes of the present invention, the entire circuit 20 may be regarded as a source of a suitable control voltage Vm for the circuit 40 of the present invention. A current source 26 is provided, and serves to draw a certain current Im through a chain of resistors R25; R25c-R25a from the voltage signal Vm. Consecutive nodes 42, 44, 46, 48 of the resistor chain are each connected to the base terminal of a respective transistor Tr4d, Tr4c, Tr4b, Tr4a. Each of the emitter follower transistors Tr4a-Tr4d may be provided with a base resistor connecting its base terminal to the corresponding node on the chain of resistors R25; R25c-R25a, in order to fine tune the self-bias profile of the amplifier. Each of these transistors Tr4d, Tr4c, Tr4b, Tr4a has its collector terminal connected to a supply voltage Vcc, and its emitter terminal connected to a respective node of a further chain of resistors R24; R24c, R24b, R24a. A further resistor R23 connects this resistor chain to the node 10 between resistors R20 and R22, the bias current injection point.

The operation of the circuit of FIG. 2 is as follows. Current source 26 draws a relatively constant current Im through resistor chain 25, comprising resistors R25c, R25b, R25a. Each of these resistors has an essentially constant resistance. Accordingly, there will be an essentially constant voltage differential between nodes 42 and 44. Another essentially constant voltage differential between nodes 44 and 46; and a further essentially constant voltage differential between nodes 46 and 48. Any variation in the absolute voltage Vm will cause a corresponding absolute variation in the value of the respective voltages at each node 44, 46, 48. At a relatively high value of Im, the voltage at node 42 may be sufficient to render transistor Tr4d conductive, but the voltages at nodes 44, 46 and 48 may respectively be insufficient to render transistors Tr4c, Tr4b and Tr4a conductive. The bias impedance of Tr1 will accordingly include all of resistors R21, R22, R23, R24a, R24b and R25c. At a lower value of Im, the voltages at nodes 42 and 44 may both be sufficient to render both associated transistors Tr4d and Tr4c conductive. The voltages at nodes 46 and 48 may still be insufficient to render their respective transistors Tr4b, Tr4a conductive. Accordingly, the bias impedance for transistor Tr1 includes resistors R21, R22, R23 R24a and R24b but not resistor R24c. Similarly, at a relatively low value of current Im, all of nodes 42, 44, 46 and 48 may be at voltages high enough to render their respective associated transistors Tr4d-Tr4a conductive. In this case, the bias impedance for transistor Tr1 includes resistors R21, R22 and R23, but not resistors R24a, R24b, R24c.

Other numbers of transistors Tr4 and resistors R25, R24 may be provided, and the operation will be analogous. Other methods and apparatus may be provided for selectively rendering transistors Tr4a-Tr4d conductive. Some of these alternatives will be discussed below.

Figure 3:
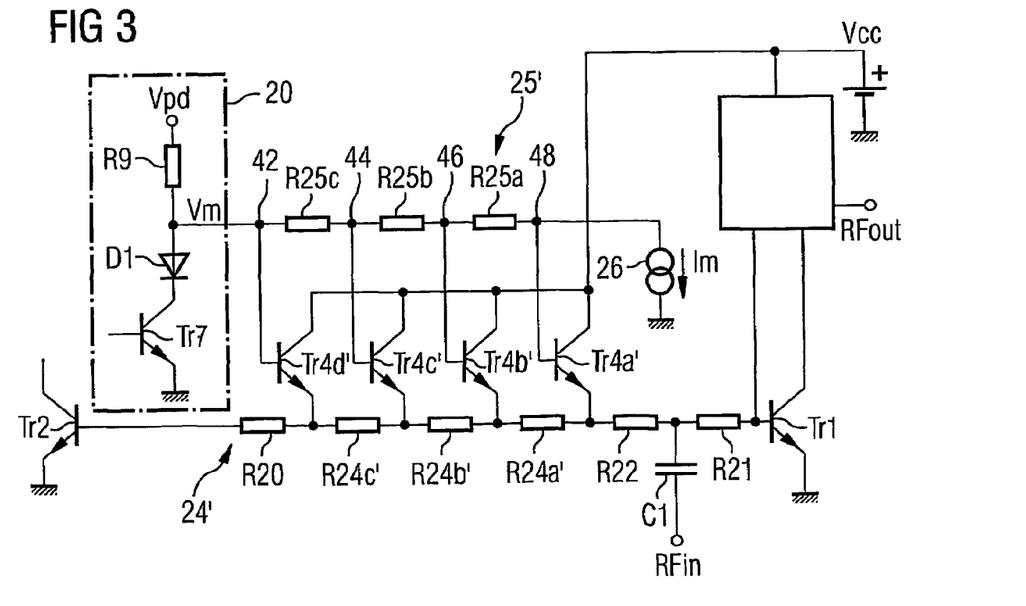
FIG. 3 shows a generalised circuit diagram of an embodiment of the present invention according to a second realisation of the present invention.

FIG. 3 shows a generalised form of an alternative ('horizontal') realisation of the present invention. The current mirror comprising transistors Tr1 and Tr2 is again provided, although the present invention is also applicable to amplifiers which do not include the current mirror transistor Tr2.

In such case, the power amplifying transistor Tr1 has its base terminal connected through resistors R21, R22 to the resistor chain R24*a*'-R24*c*'.

Resistors R20, R21 and R22 are again placed in series between the respective base terminals of transistors Tr1 and Tr2. However, in this alternative realisation, the resistor chain referred to as R24*c*-R24*a* in the vertical realisation of FIG. 2 is replaced by a 'horizontal' resistor chain R24*c*'-R24*a*' placed in series between resistors R20 and R22. Respective transistors Tr4*d*', Tr4*c*', Tr4*b*', Tr4*a*', corresponding to transistors Tr4*d*-Tr4*a* of the realisation of FIG. 2, have their respective emitter terminals connected to respective nodes between resistors of the resistor chain R20, R24*c*'-R24*a*', R22. The transistors Tr4*d*' each have their base terminal connected to respective nodes 42, 44, 46, 48 of the resistor chain R25*c*-R25*a*, as described with reference to FIG. 2. Each of the emitter follower transistors Tr4*a*'-Tr4*d*' may be provided with a base resistor connecting its base terminal to the corresponding node on the chain of resistors R25; R25*c*-R25*a*, in order to fine tune the self-bias profile of the amplifier. The remainder of the circuit is as described with reference to FIG. 2. In the example of an amplifier for a mobile telephone handset, the signal RFin may be an RF signal for transmission. The DC quiescent point of operation of the amplifier is set by the DC current flowing through resistors R22 and R21, and circuit operation is further determined by the state of conduction of the transistors Tr4*a*'-Tr4*d*'.

The operation of the circuit of FIG. 3 is as follows. Current source 26 draws a relatively constant current Im through resistor chain 25', comprising resistors R25*c*, R25*b*, R25*a*. Each of these resistors has an essentially constant resistance. Accordingly, there will be an essentially constant voltage differential between nodes 42 and 44. Another essentially constant voltage differential between nodes 44 and 46; and a further essentially constant voltage differential between nodes 46 and 48. Any variation in the absolute voltage Vm supplied by control circuit 20 will cause a corresponding absolute variation in the value of the respective voltages at each node 44, 46, 48. At a relatively high value of Im, the voltage at node 42 may be sufficient to render transistor Tr4*d*' conductive, but the voltages at nodes 44, 46 and 48 may respectively be insufficient to render transistors Tr4*c*', Tr4*b*' and Tr4*a*' conductive. The bias impedance of Tr1 will accordingly include all of resistors R21, R22, R24*a*', R24*b*' and R25*c*'. At a lower value of Im, the voltages at nodes 42 and 44 may both be sufficient to render both associated transistors Tr4*d*' and Tr4*c*' conductive. The voltages at nodes 46 and 48 may still be insufficient to render their respective transistors Tr4*b*', Tr4*a*' conductive. Accordingly, the bias impedance for transistor Tr1 includes resistors R21, R22, R24*a*' and R24*b*' but not resistor R24*c*'. Similarly, at a relatively low value of current Im, all of nodes 42, 44, 46 and 48 may be at voltages high enough to render their respective associated transistors Tr4*d*'-Tr4*a*' conductive. In this case, the bias impedance for transistor Tr1 includes resistors R21 and R22, but not resistors R24*a*', R24*b*', R24*c*'. This would be used for a high power/high quiescent current mode.

Other numbers of transistors Tr4' and resistors R25, R24' may be provided, and the operation will be analogous. Other methods and apparatus may be provided for selectively rendering transistors Tr4*a*'-Tr4*d*' conductive. Some of these alternatives will be discussed below.

Semi-lumped power cell build refers to a technique of physical layout on chip, whereby large transistor Tr1 may be built up of N smaller transistors, where individual or small groups of these smaller transistors are DC fed from a common node (in this case, the node between R21 and R22) through a single or a small bank of low valued resistors. These resistors are collectively represented as R21 in FIG. 3. An input signal, such as an RF signal, is injected into this common node through a single capacitor C1. Resistor R22 sets the minimum bias impedance that can be achieved.

The horizontal realisation has certain advantages. In both high and low power modes, the current flowing in the Tr2 collector remain more constant than in the equivalent 'vertical' realisation when different emitter followers Tr4* are activated, due to the changing bias injection point altering the DC mirror function between the two transistors Tr1 and Tr2. Keeping the collector current in Tr2 more constant in different modes helps the operation of the control loop, and is a possible alternative to needing to modify the 'reference' or 'sense' outputs of the circuit 20.

On the other hand, the horizontal realisation does have a disadvantage, in that the changing bias injection point causes the base feed resistors of transistors Tr1 and Rr2 to be no longer in exact proportion to the transistor areas, making the circuit more prone to unwanted asymmetric currents forming over temperature, and possible thermal runaway of Tr1.

Figure 4:
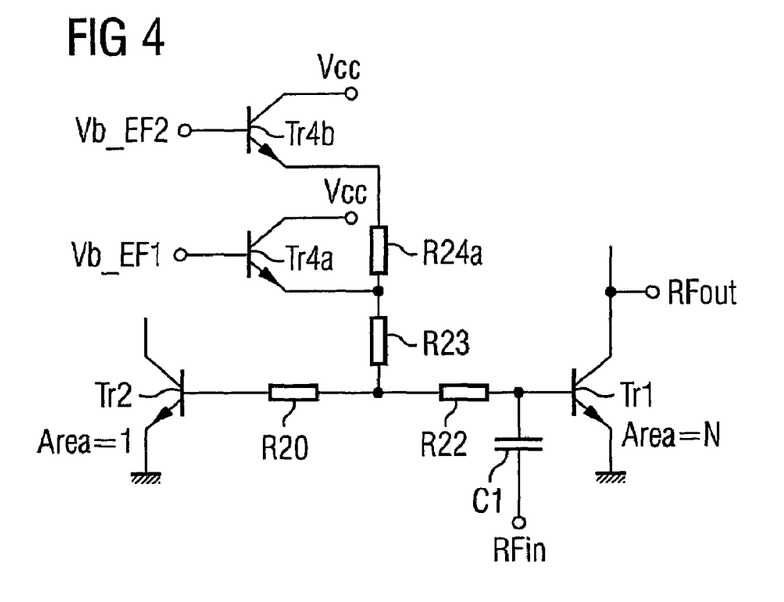
FIG. 4 shows a basic embodiment of the present invention according to the first realisation.

FIG. 4 shows a simple embodiment of the present invention according to the first ('vertical') realisation. Two emitter followers Tr4*a*, Tr4*b* are provided. The emitter followers are selectively enabled by appropriate application of voltages Vcc, Vb_EF1 and Vb_EF2. Examples of the arrangement of these voltages will be discussed below. When emitter follower Tr4*b* is activated by a relatively high voltage on Vb_EF2, quiescent current is supplied to transistors Tr1 and Tr2 through a bias impedance including both resistors R24*a* and R23. Such bias arrangement would be particularly suited to operation in a low power/low quiescent current mode. When the emitter follower Tr4*a* is activated by a relatively high voltage on Vb_EF1, quiescent current is supplied to transistors Tr1 and Tr2 through a bias impedance including resistor R23 but not resistor R24*a*. Such bias arrangement would be particularly suited to operation in a high power/high quiescent current mode.

Resistors R20 and R22 have values in the ratio N:1, where N represents the ratio of the emitter areas of the transistors Tr1, Tr2, transistor Tr1 has an emitter area N times the emitter area of Tr2. Resistor R21 is set to zero. The capacitance of capacitor C1 is selected to be Cb*N, where Cb is the base input capacitance of the transistor Tr1. Only two resistors are provided in the resistor chain 24, being resistors R23 and R24*a*. Correspondingly, only two controlled emitter followers Tr4*a* and Tr4*b* are provided. The base terminals of the transistors Tr4*a* and Tr4*b* are connected to respective control signals Vb_EF1 and Vb_EF2.

Figure 5:
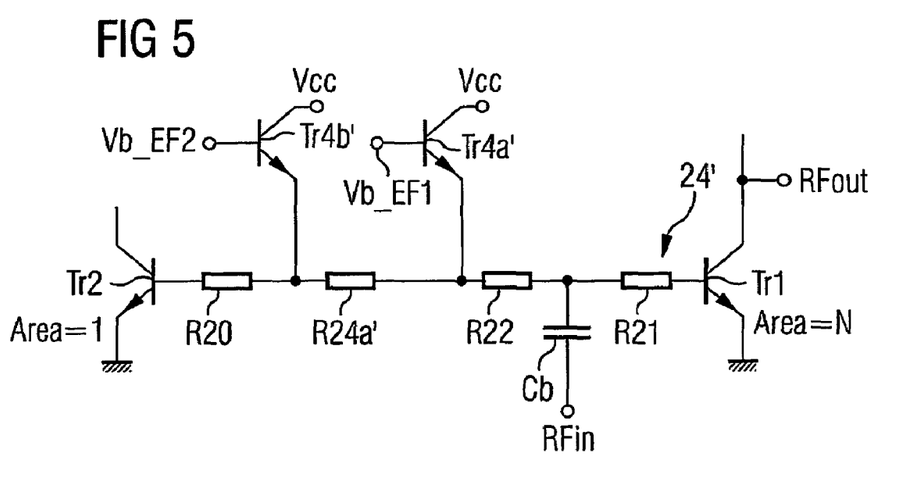
FIG. 5 shows a basic embodiment of the present invention according to the second realisation.

FIG. 5 illustrates a first particular embodiment of the present invention according to the second ('horizontal') general realisation of the present invention. Transistor Tr1 has an emitter area N times the emitter area of Tr2. Only four resistors are provided in the resistor chain 24', being resistors R20, R24*a*', R22 and R21. Correspondingly, only two controlled emitter followers Tr4*a*' and Tr4*b*' are provided. The base terminals of the transistors Tr4*a*' and Tr4*b*' are connected to respective control signals Vb_EF1 and Vb_EF2.

Different quiescent bias points require different bias impedances for a given modulation type. Higher RF input levels require lower bias impedances and higher quiescent points, to avoid distortion of the amplified signal, where linearity is important. The circuit of FIG. 5, and other circuits discussed in the present application, aim to provide a bias impedance that is a function of an input signal level.

Circuitry (not illustrated) is connected to the circuitry of FIG. 5 to provide a base voltage Vb_EF1 to transistor Tr4a' which is lower than the base voltage Vb_EF2 applied to transistor Tr4b'. This circuitry may be as illustrated in FIGS. 2 and 3, or may be any other suitable circuitry. In a given 'low power' condition, transistor Tr4b' is conductive but transistor Tr4a' is not conductive, due to its lower applied base voltage. All of the base drive current to transistor Tr1 is supplied through transistor Tr4b' and resistors R24a', R22 and R21. Operation will settle at a certain level of quiescent current, in the absence of any input signal RFin.

In the absence of an input signal RFin, or where the input signal is at a low level, the circuit will operate in a 'low power' mode. The bias impedance of transistor Tr1 will be relatively high, as resistor R24a' is included. The current ratio between transistors Tr2 and Tr1 will approximate to R20:(R24a'+R22+R21). This would be used for a low power, low quiescent current mode.

With a high level of input signal RFin, but with transistor Tr4a' still non-conductive, the voltage perturbations at the emitter of transistor Tr4a' are of adequate magnitude to cause transistor Tr4a' to operate as an emitter follower, at least on the negative-going half cycles of the voltage perturbations. The circuit will begin to operate in a 'high power' mode. The bias impedance to transistor Tr1 will be low, as resistor R24a' will be excluded from the bias resistance of transistor Tr1, at least for the negative-going half cycles of the perturbations. The base current ratio between the transistors approximates to (R20+R24a'):(R22+R21).

At input signal levels between these extremes, an intermediate bias impedance and current ratio will be provided. Further emitter followers and resistors may be added, as discussed with reference to FIG. 3, in order to smooth the transition between 'high' and 'low' power modes, and to thereby maintain linearity over a large power range.

It can accordingly be seen that the bias injection point effectively changes as a function of the input signal RFin level. This in turn affects the base current ratios between Tr1 and Tr2, such that the current in Tr2 varies significantly less than the current in transistor Tr1. By suitably selecting the component values, it may be possible to achieve all of the required bias impedance variation without changing any of the applied voltages Vcc, Vb_EF1 and Vb_EF2, such that the level of the incoming signal RFin determines the bias injection point without the intervention of other circuitry. Weighing against this option is the possibility of thermal runaway. To avoid the possibility of thermal runaway, the 'vertical' arrangement of FIG. 2 may be used, providing input signal level controlled variation of the bias impedance in a similar way, although the quiescent current level would need to be adjusted independently, according to the level of the input signal RFin. For example, a rectified copy of the input signal could be used to control the quiescent current level.

Further particular embodiments of the circuits discussed with reference to FIGS. 2-5 will be discussed in the following part of the description.

Figure 6:
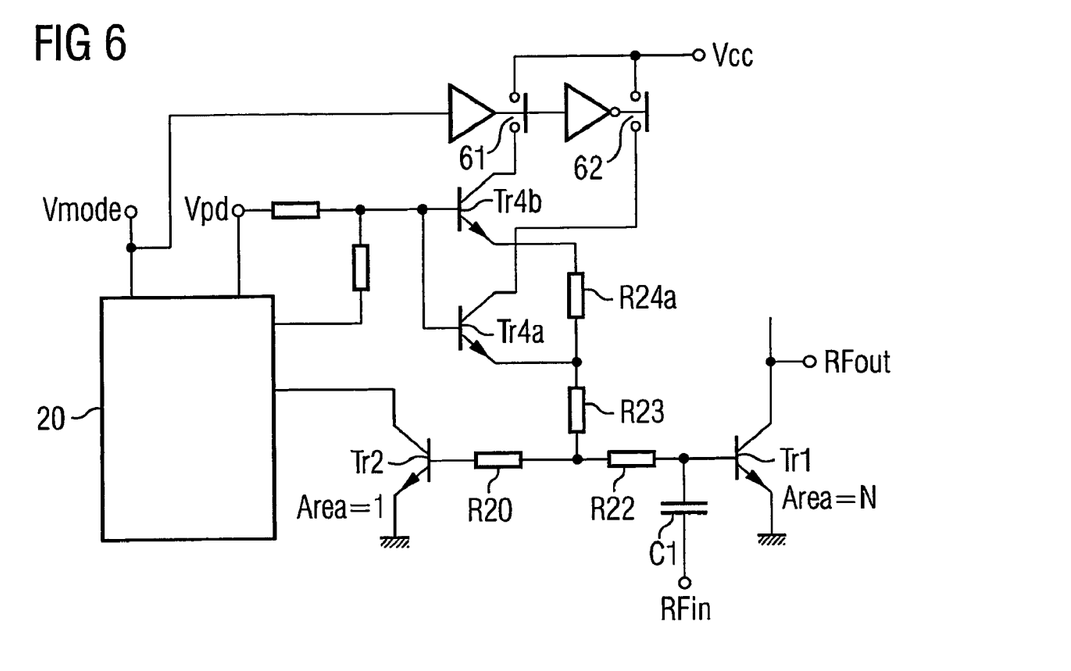
FIG. 6 shows a first circuit arrangement to provide control voltages to a circuit such as that shown in FIG. 4.

FIG. 6 shows a particular embodiment of the circuit of FIG. 4. Here, a mode control voltage Vmode is provided, to enable only a selected one of transistors Tr4a or Tr4b. This is achieved by causing voltage Vmode to apply inverse control voltages to respective switches 61, 62, each capable of connecting and disconnecting a respective collector terminal of transistors Tr4b, Tr4a to/from the supply voltage Vcc. The remainder of the circuit is as described with reference to FIG. 4. Obviously, resistor R24a may only form a component of the base impedance of transistor Tr1 whichever of the transistors Tr4a, Tr4b are enabled. Switches 61, 62 may be embodied as mechanical relays, transistors or other semiconductor devices as required. These switches may need realised off-chip. Care must be taken to avoid excessive base-emitter leakage through the non-enabled emitter follower transmitter Tr4*, particularly if operated at high RF power.

Figure 7:
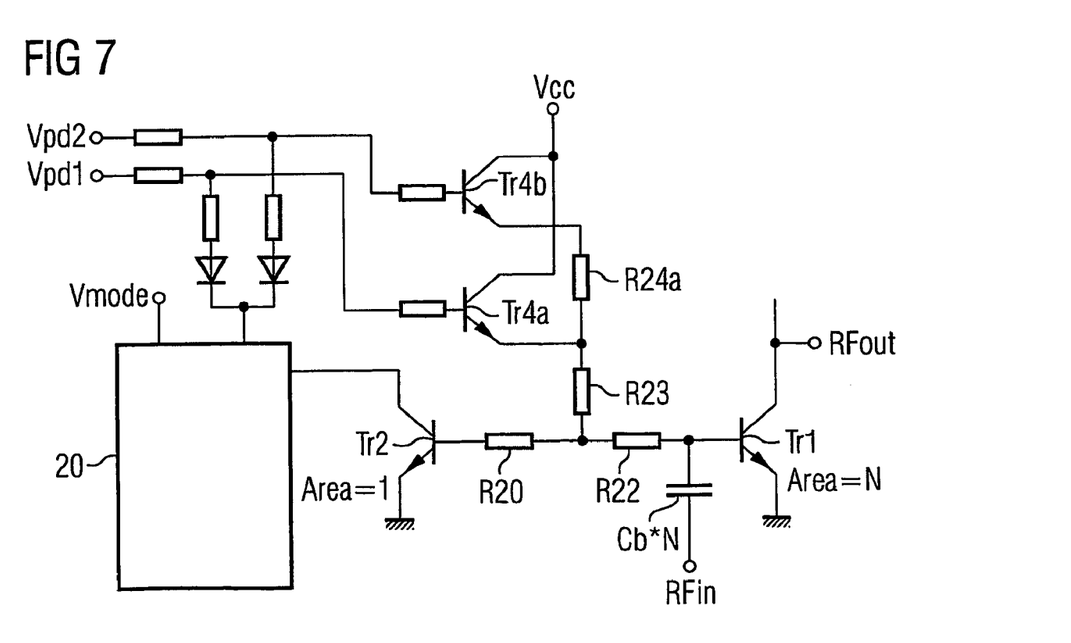
FIG. 7 shows a second circuit arrangement to provide control voltages to a circuit such as that shown in FIG. 4.

In FIG. 7, the Vmode signal is not used to control transistors Tr4a, Tr4b. The collector terminals of these transistors are connected to supply voltage Vcc. Rather, separate base control signals Vpd2, Vpd1 are provided to the respective base terminals of transistors Tr4b, Tr4a. An additional, controlled signal Vpd must accordingly be provided. This problem may be avoided as described below with reference to further embodiments. The remainder of the circuit is as described with reference to FIG. 4.

Figure 8:
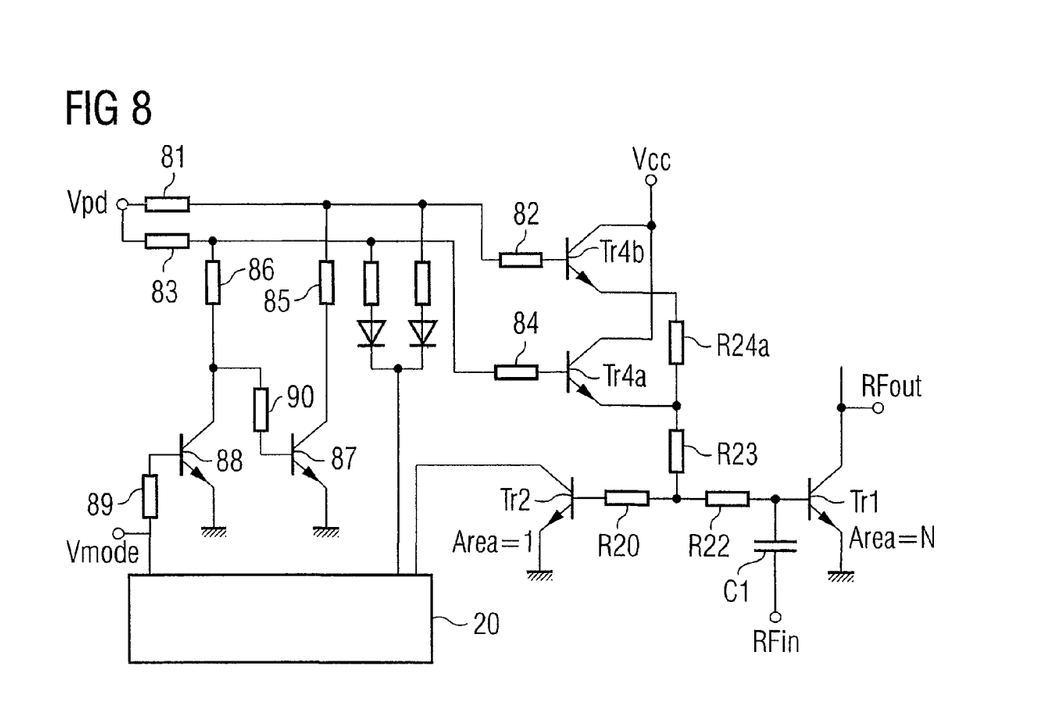
FIG. 8 shows a third circuit arrangement to provide control voltages to a circuit such as that shown in FIG. 4.

The embodiment of FIG. 8 represents, to a certain extent, a combination of the embodiments of FIGS. 6 and 7. The Vmode signal enables only a selected one of the transistors Tr4a, Tr4b. The collector terminal of each transistor Tr4a, Tr4b are connected directly to the supply voltage Vcc. The Vmode signal operates, in this embodiment, to enable or disable the provision of a single base signal Vpd to the respective base terminals of the transistors Tr4a, Tr4b. This is achieved by applying a pull-down voltage to one of the base input paths of transistors Tr4a and Tr4b. Resistors 81, 82 are placed in series between a base terminal of transistor Tr4b and the control voltage Vpd. Resistors 83, 84 are placed in series between a base terminal of transistor Tr4a and the control voltage Vpd. The respective node between each of these pairs of resistors is connected by way of a respective third resistor 85, 86, to the collector of a respective pull-down transistor 87, 88. Pull-down transistor 88 is controlled by voltage Vmode at its base terminal, through base resistor 89. Pull-down transistor 87 is controlled through base resistor 90 by the collector voltage of pull-down transistor 88. This collector voltage represents the inverse of voltage Vmode. Hence, when Vmode is at a high value, transistor 88 is conductive, its collector voltage is low and the base voltage of transistor Tr4a is pulled low. Transistor Tr4a is accordingly held in a non-conductive state. At the same time, the base voltage of transistor 87 is low. Transistor 87 is non-conductive and the base voltage of transistor Tr4b is as determined by signal Vpd. Transistor Tr4b becomes conductive as determined by signal Vpd, and resistors R23 and R24a each form components of the base impedance of transistor Tr1.

Conversely, when Vmode is at a low value, transistor 88 is non-conductive, its collector voltage is determined by the signal Vpd and transistor Tr4a is rendered conductive as determined by applied voltage Vpd. At the same time, the base voltage of transistor 87 is high, according to the value of Vpd. Transistor 87 is accordingly rendered conductive, pulling the base terminal of transistor Tr4b low. Transistor Tr4b is held non-conductive, allowing resistor R23, but not resistor R24a, to form components of the base impedance of transistor Tr1.

The circuit arrangement of FIG. 8 has advantages in that it can be fully integrated in an on-chip solution; no off-chip components are required. It is simple to expand the circuit solution of FIG. 8 to include more emitter followers Tr4* than the two shown. However, the circuit of FIG. 8 does have some drawbacks. The current Ipd drawn from the signal voltage Vpd is increased due to the current required to pull down the unused emitter follower transistor's base voltage. The circuit provides an effective low power mode suitable for CDMA encoding in mobile telephone handsets, but may not provide a sufficiently powerful high power mode for operating AMPS encoding.

Figure 9:
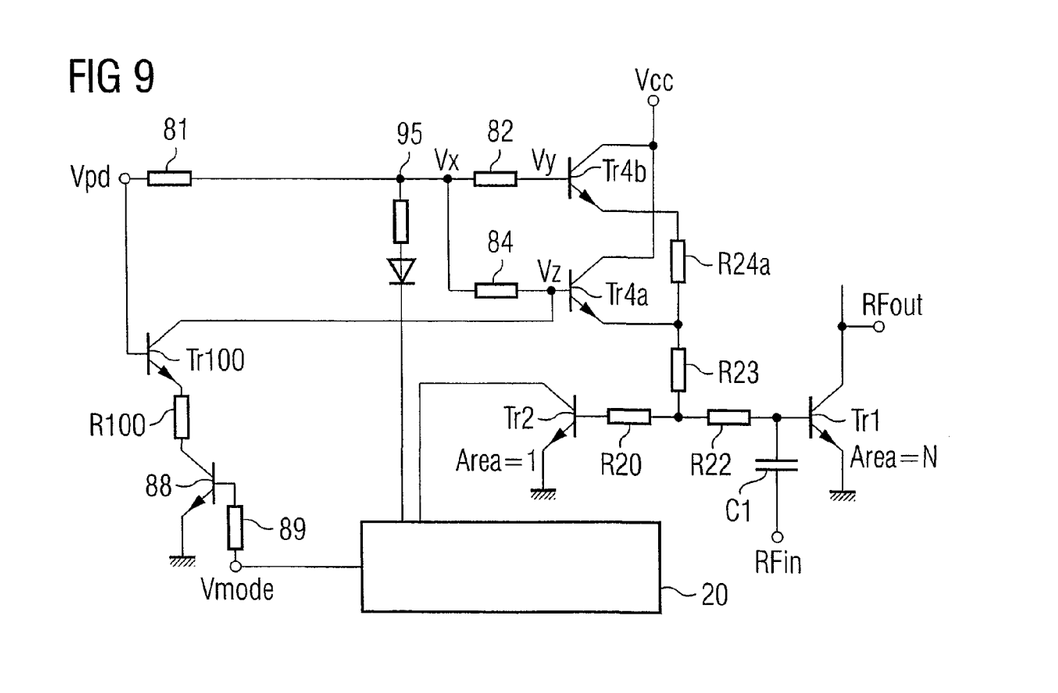
FIG. 9 shows a fourth circuit arrangement to provide control voltages to a circuit such as that shown in FIG. 4.

FIG. 9 shows a further variant of the circuit of FIG. 8. In this embodiment, the base terminal of transistor Tr4b is connected to signal Vpd through resistors 82, 81. The base terminal of transistor Tr4a is connected through resistor 84 to the node 95 between resistors 81 and 82, which is at a voltage Vx. The voltage at the base terminal of transistor Tr4a is at a voltage indicated as Vz. While transistor Tr4b is effectively always controlled by signal Vpd through resistors 81 and 82, transistor Tr4a is enabled or disabled by signal Vmode as follows. Signal Vmode is applied through resistor 89 to the base of transistor 88, as in FIG. 8. The collector of transistor 88 is connected through resistor R100 to the emitter of a further transistor Tr100. The base terminal of transistor Tr100 receives the controlling voltage Vpd, while the collector of transistor Tr100 is connected to the base terminal of transistor Tr4a.

When Vmode is at a high level such as 3.0V, transistor 88 is rendered conductive. This draws a current from resistor R100, and pulls the voltage at the emitter terminal of transistor Tr100 to less than one Vbe below Vpd, turning transistor Tr100 on. Transistor Tr100 then operates as a DC current source, drawing a constant current through resistor 84. This in turn brings the voltage Vz at the base terminal of transistor Tr4a to a lower value, turning transistor Tr4a off. Transistor Tr4b is conductive, as determined by signal voltage Vpd. Resistors R24a and R23 both form components of the base impedance for transistor Tr1. All the bias current to transistors Tr1 and Tr2 flows in transistor Tr4b, through resistors R24a and R23. The circuit operates as required for a low quiescent current, low power and high bias impedance mode, suitable for low power CDMA.

When Vmode is at a low level such as 0V, transistor 88 is rendered non-conductive. No current is drawn from resistor R100, and the base-emitter voltage of transistor Tr100 remains less than Vbe, causing transistor Tr100 to remain non-conductive. This in turn leaves the voltage Vz at the base terminal of transistor Tr4a unaffected. Transistor Tr4a may be rendered conductive, according to signal voltage Vpd. Transistor Tr4b is conductive, as determined by signal voltage Vpd. Resistors R24a and R23 both form components of the base impedance for transistor Tr1. However, the path through transistor Tr4a will dominate, due to the presence of the resistance R24a, and the overall effect will be virtually the same as simply admitting resistor R23 into the base impedance of transistor Tr1. The circuit accordingly runs in high bias current/high power mode, suitable for high power CDMA.

Both modes support saturated modulated signals such as AMPS as well. The high power mode allows a high input signal (RF) power to be reached with modest efficiency, but the circuit is designed so that it is better to run AMPS in the low power mode. Here, the low power efficiency is higher due to the lower quiescent current. As the power increases, there comes a point where the voltage swing at the emitter follower nodes is sufficiently great that the emitter follower Tr4a becomes active again, and high power can be achieved, albeit in a somewhat more non-linear fashion.

Advantages provided by the circuit of FIG. 9 include effective switching between high and low current modes, controlled by the Vmode signal; it is simple to expand the circuit of FIG. 9 to control more than the two emitter followers Tr4* shown in the diagram; both low power mode and an effective high power mode capable of supporting high power AMPS may be obtained. The circuit may be realised fully on-chip. No off-chip components are required. A potential drawback of the circuit of FIG. 9 is in that a certain increase in Ipd is required to pull the unused transistor's base voltage down.

While the arrangements of FIGS. 6-9 have been discussed in the context of the first ('vertical') general realisation as shown in FIG. 2, corresponding arrangements may be applied in the context of the second ('horizontal') general realisation of FIG. 3.

FIGS. 10-14 show certain particular arrangements according to embodiments of the present invention, according to the second ('horizontal') general realisation as shown in FIG. 3. These circuit options aim to provide a bias impedance for transistor Tr1 which is a function of the level of the input signal RFin. The circuits shown provide 'quasi-variable' bias impedance, in lieu of a truly linearly varying bias impedance. There is some risk of thermal runaway in such horizontal arrangement, but other advantages of this arrangement may outweigh any such difficulty.

Figure 10:
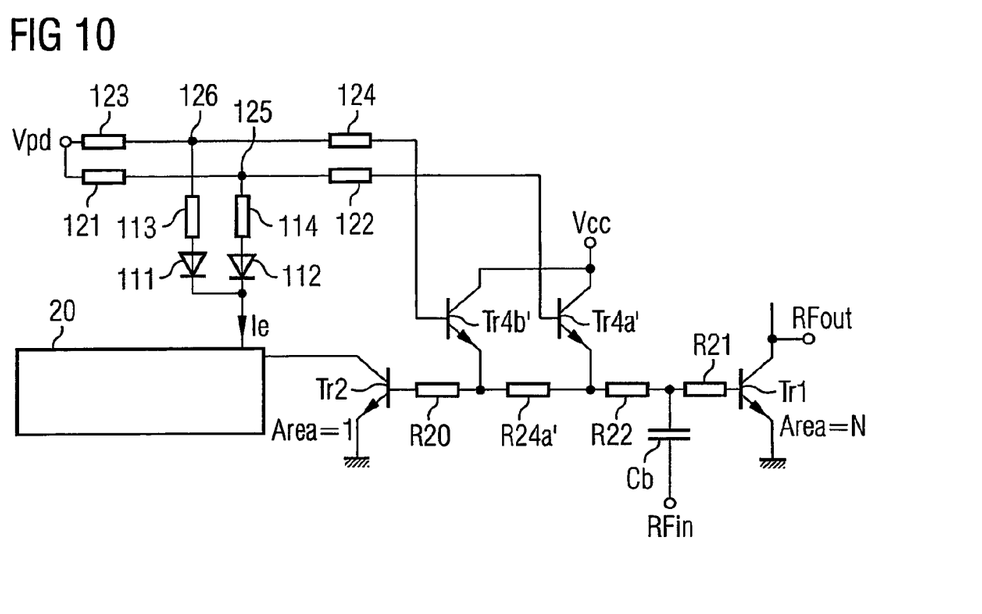
FIG. 10 shows a first circuit arrangement to provide control voltages to a circuit such as that shown in FIG. 5.

FIG. 10 shows a variant of the circuit of FIG. 5, in which the respective base terminals of the transistors Tr4a', Tr4b' are provided by signal Vpd through respective different series resistors 121, 122; 123, 124. A current of value Ie is drawn from the combination of diodes 111, 112 by the control loop 20. This will cause differing voltages at nodes 125, 126 respectively lying between resistors 121 and 122; and resistors 123 and 124. These differing voltages will have respective differing effects on the states of conduction of the transistors Tr4a', Tr4b'. The ratios of the values of resistors 123 and 113; and 121 and 114 in combination with the other components are contrived such that, for a given value of Ie, the base voltage of transistor Tr4a' will be lower than the base voltage of transistor Tr4b'.

Advantages of the circuit arrangement of FIG. 10 include its simplicity, and the ease with which the circuit may easily be expanded to supply more than the two emitter follower transistors Tr4* shown. However, the absolute difference between the base voltages of the emitter follower transistors Tr4* will be variable as Ie varies, for example in order to maintain the value of Ic with temperature, and the high values of resistors required may compromise the RF performance of the circuit.

Figure 11:
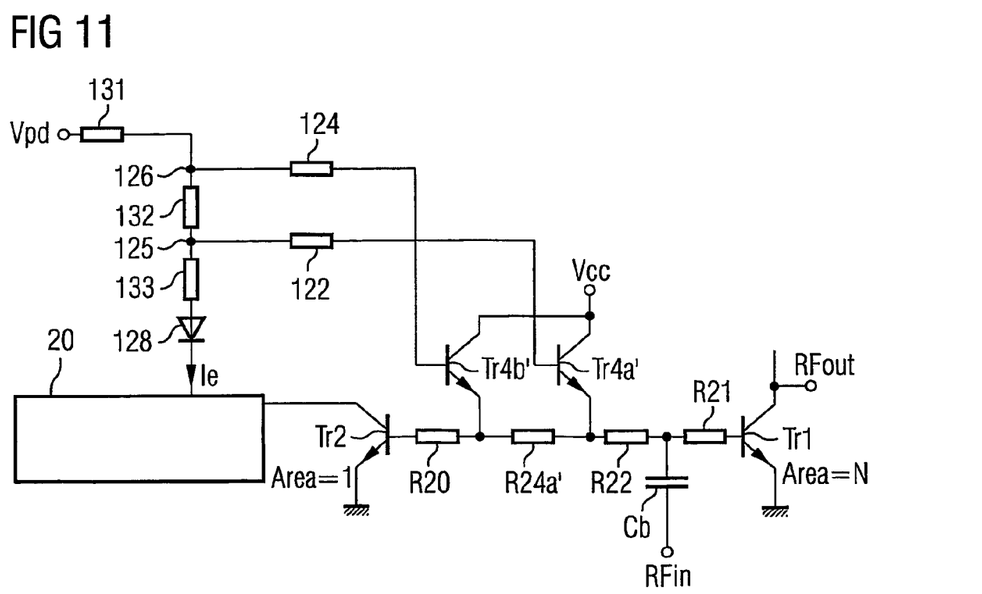
FIG. 11 shows a second circuit arrangement to provide control voltages to a circuit such as that shown in FIG. 5.

FIG. 11 shows a variation on the circuit of FIG. 10, and represents an alternative bias arrangement which also allows the bias impedance to transistor Tr1 to vary with the level of the input signal RFin. In the embodiment of FIG. 11, the signal voltage Vpd is applied to a resistor chain 131, 132, 133, which in turn feeds a diode 128 to supply current Ie to control loop 20. Since current Ie causes a voltage drop across resistor 132, the voltage at node 125, supplied through resistor 122 to the base terminal of transistor Tr4a' will be less than the voltage at node 126, provided through resistor 124 to the base terminal of transistor Tr4b', by a value equal to the product of Ie and the resistance of resistor 132.

The arrangement shown in FIG. 11 is also simple, and can be simply amended to provide base voltages for more than the two emitter follower transistors Tr4* shown. However, as with the circuit of FIG. 10, the absolute difference between the base voltages of the emitter follower transistors Tr4* will be variable as Ie varies, for example in order to maintain the value of Ic with temperature, and the high values of resistors required may compromise the RF performance of the circuit.

Figure 12:
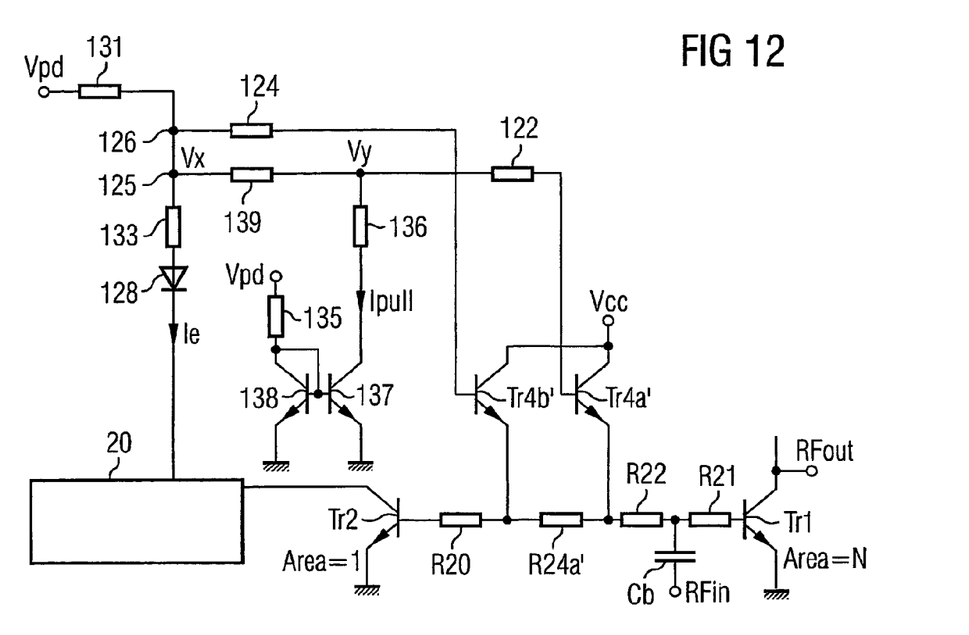
FIG. 12 shows a third circuit arrangement to provide control voltages to a circuit such as that shown in FIG. 5.

FIG. 12 shows a variation on the circuit of FIG. 11. Resistor 132 is effectively set to zero, placing both nodes 126, 125 at a same voltage, Vx. The control loop 20 sets up a certain current Ie, which in turn establishes a certain voltage at Vx. Circuitry 135-139 represents a current mirror driven by signal voltage Vpd. This current mirror draws additional current Ipull through resistor 139, effectively lowering voltage Vy at the node between resistors 122 and 139, thereby lowering the base voltage of transistor Tr4a', in response to a high value of control voltage Vpd. The difference between voltages Vx and Vy, and accordingly between the base voltages of the transistors Tr4b' and Tr4a' is approximately constant.

The arrangement shown in FIG. 12 can be simply amended to provide base voltages for more than the two emitter follower transistors Tr4* shown. However, the values of resistors required may compromise the RF performance of the circuit.

Figure 13:
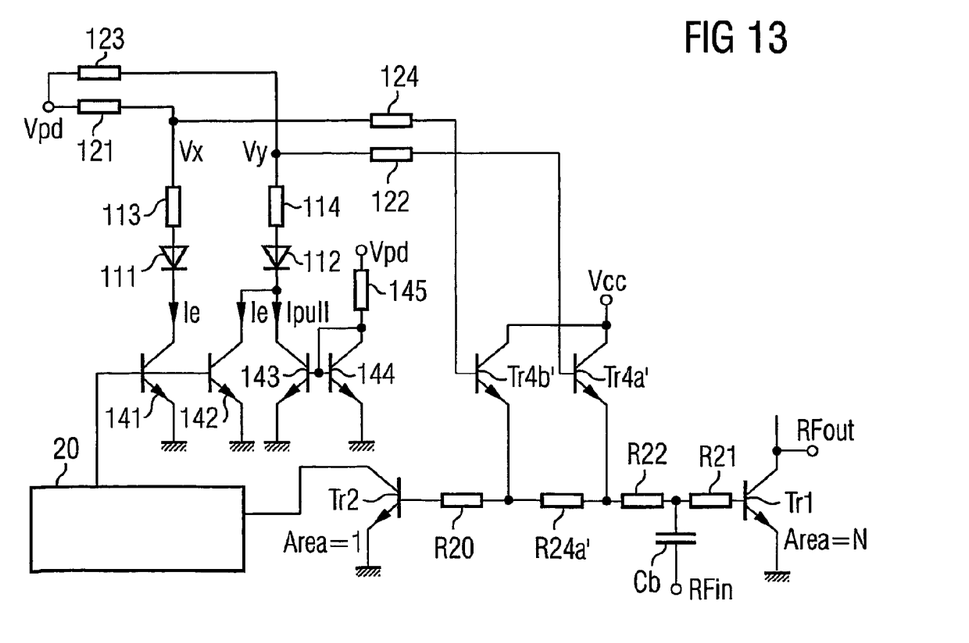
FIG. 13 shows a fourth circuit arrangement to provide control voltages to a circuit such as that shown in FIG. 5.

FIG. 13 shows a development of the circuits of FIGS. 10 and 12. The control loop 20 is modified such that the output transistor Tr7 is replaced with two identical transistors 141, 142 transistors in parallel, and sets up a certain current Ie through resistors 121, 113 and diode 111. This current in turn establishes a certain voltage at Vx. A current mirror 141, 142 causes an identical current Ie to be drained from diode 112. A further current mirror 143, 144, controlled by signal voltage Vpd, draws a further current Ipull from diode 112. The value of Ipull is set by voltage signal Vpd and the value of resistor 145. The combined current of (Ie+Ipull) causes a corresponding drop in the voltage Vy. When Vpd=0, causing Ipull=0, then Vx=Vy. When Vpd>Vbe, causing Ipull>0, Vy<Vx. For the circuit shown, Ipull will be virtually constant, leading to a similarly virtually constant difference between Vx and Vy.

Figure 14:
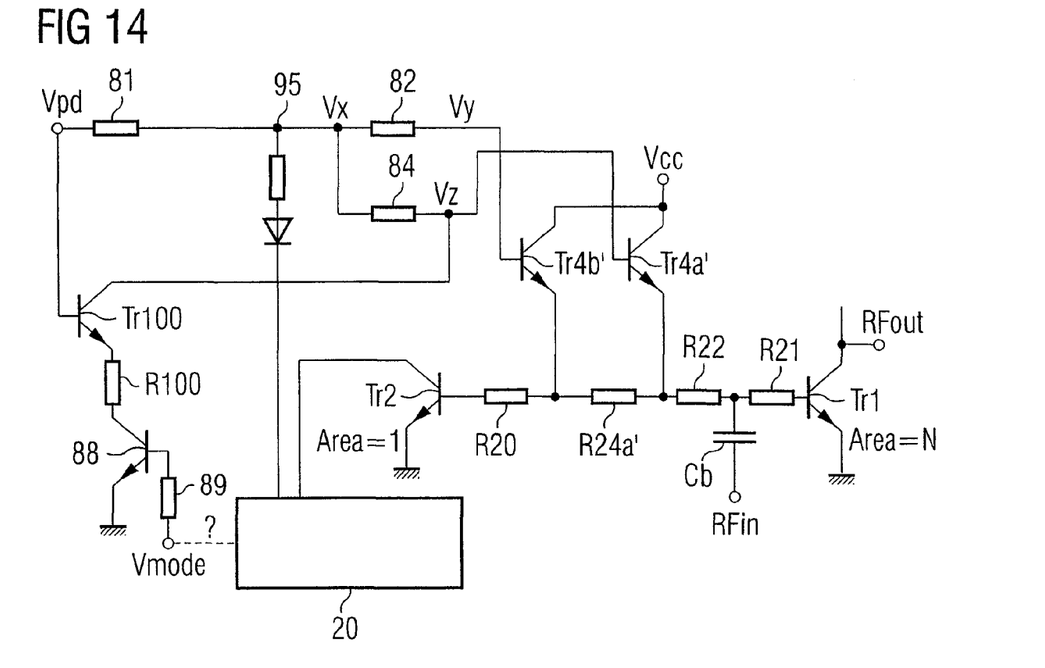
FIG. 14 shows a fifth circuit arrangement to provide control voltages to a circuit such as that shown in FIG. 5.

FIG. 14 illustrates the embodiment of FIG. 9 adapted for use in a realisation according to the second general realisation of FIG. 3. The signal Vmode may be connected to the control loop 20 if required. This figure also serves as an illustration of how the various embodiments described above with reference to one or other of the general realisations of FIGS. 2-3 may be adapted for use in an embodiment according to the respective other realisation.

The transistor switch 88 pulls the resistor R100 to the ground voltage when a high Vmode signal is applied. The signal voltage Vpd is applied to the base of transistor Tr100, and causes the collector connection of Tr100 to operate as a DC current source, due to the presence of resistor R100. The current drawn by this current source reduces the voltage at Vz, causing the base voltage of transistor Tr4a' to be at a lower value than the base voltage of transistor Tr4b', due to the voltage drop across resistor 84 caused by the current drawn by transistor Tr100.

Under low level input signal RFin, transistor Tr4a' will be non-conductive as its base voltage is lower than that of Tr4b'∝0. The circuit is arranged such that transistor Tr4b' is conductive, and the transistor Tr1 is biased through transistor Tr4b' and resistors R24a', R22 and R21. As the input signal level is increased, the voltage at the bases of transistors Tr1 and Tr2 vary. At least on the negative-going half cycles, the base-emitter voltage of transistor Tr4a' may become sufficient to bring that transistor into conduction, thereby reducing the bias impedance to Tr1. This circuit has the advantages of being relatively simple, and easy to expand to control more than the two emitter follower transistors Tr4* shown, which in turn may provide a smoother more linear variation in bias impedance.

A more complete description of the operation of the circuit of FIG. 1 will now be provided. The circuit of FIG. 1 represents an example power amplifier schematic for a practical circuit that provides the following: a high power mode for CDMA; a low power mode for CDMA; and AMPS compatible in both high power and low power modes.

Typical values for Vcc are 3.0V-6.0V, and Vpd is typically 2.8V. For operation in high power mode, the control signal Vmode is set low, for example at 0V. Transistor Tr12 is off. Tr10 and Tr11 are also off, and effectively not in circuit. The control loop 20 works largely as described in UK Patent Application GB0304053.2 and sets the Tr1 collector current to the desired level. The configuration of the circuit, by the removal of the C2 capacitor, and the splitting of Tr4 into two separate transistors, and the inclusion of extra resistors R20-R25 gives the circuit a self-biasing mechanism suitable for power amplifiers as described above. Preferably, the ratio of resistor values R20:(R22+R21) is set to be the same ratio as Tr2 emitter area:Tr1 emitter area. With no input signal RFin applied, the bias current injected into Tr1 and Tr2 will be in the ratio of the device areas, and will be largely supplied by Tr4a. Tr4b will be largely deactivated, since the relatively large value of R24 will make Tr4a the preferred route for the bias current. Under increasing input signal drive level, the 'forward' current half cycle will itself drive the base of Tr1 through C1. During this half of the input signals cycle, the voltage at emitter of Tr4a will be slightly higher, increasingly deactivating it. During the 'reverse' current half cycle, the input signal current flow in the opposites direction through C1 will come largely from the Tr4a emitter, through a bias impedance of approximately R23+R22. The net DC current into Tr1 increases, and the circuit effectively self biases to a higher level to support the amplified output signal RFout level required in an efficient manner. A linear (e.g. CDMA) or saturated (e.g. AMPS) signal can be used in this mode. For the AMPS signal it will be more usual to use the low power mode.

For operation in the low power mode, the control signal Vmode is set to a relatively high value, such as 3.0V. With Vmode high, transistor Tr12 is on. Tr10 and Tr11 are therefore also on. The Vpd feed to the bases of these devices in combination with the emitter resistors to ground cause the collectors of Tr10 and Tr11 to operate as good DC current sources. The DC current flowing in Tr10 adds to the current flow in R4. The current flow in R4 is used by the control loop 20 to 'measure' the current in Tr1. This extra current in R4 will cause the control loop 20 to react as if transistor Tr1 were running at a higher collector current level than required. The bias circuit control loop 20 will therefore compensate to make the current flowing in R4 equal to that flowing in R3 as usual. In this way, Tr1 collector current will be reduced to a level desired for low power mode operation. The Tr11 current source effectively places a negative voltage offset on the base of Tr4a with respect to the base of Tr4b by the action of it passing through R25. This effectively deactivates Tr4a. Transistors Tr1, Tr2 are therefore biased by current flow from the emitter of Tr4b. Under low, but increasing input signal drive level, the 'forward' current half cycle will drive the bases of transistors Tr1 and Tr2 through C1. During this half of the input signal cycle, the voltage at emitter of Tr4b will be slightly higher, increasingly deactivating it. During the 'reverse' current half cycle, the input signal current flow in the opposite direction through C1 will come largely from the Tr4b emitter, through a bias impedance of approximately R24+R23+R22, a higher bias impedance as required for low power mode of operation. This allows for a more efficient CDMA amplification, but up to a lower maximum output power. If a higher output power is required, the circuit needs to be switched into the high power state.

For AMPS signals on the other hand, the low power mode offers efficient AMPS amplification for low level signals, but also for high level signals, due to an additional mechanism that comes into play. As input signal levels increase further, there comes a point where the input signal voltage swing at the base nodes of Tr1 and Tr2 reaches sufficiently high level to overcome the base offset voltage (Im.R25) of Tr4a, and this transistor becomes active again. Under these conditions the bias impedance drops to approximately the value in the high power mode, and an AMPS signal continues to be amplified to a very high power level. In this two-transistor implementation for Tr4, this mechanism is not suitable for CDMA due to the negative impact on linearity. Additional Tr4 elements can be added to improve the linearity to higher levels, and ultimately it is possible that several sections could be used to provide a scheme that allows a high power CDMA signal to be developed from a very low starting quiescent bias point. This approach would allow for a very efficient and simple power amplifier to be realised.

Figure 15:
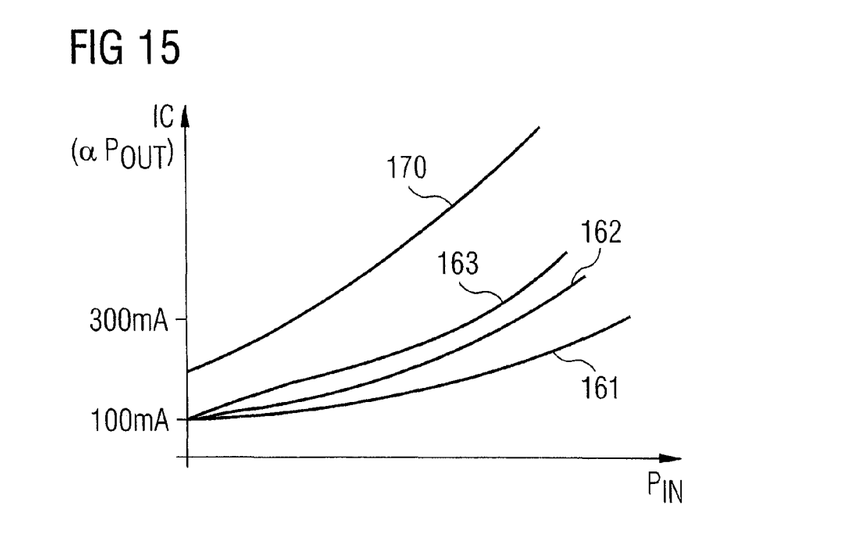
FIG. 15 shows typical variation in collector current under the influence of increasing RF input power, for various modes, later discussed.

FIG. 15 shows the relationship between the input power Pin, being the input signal power supplied by RFin, and Ic, the collector current of transistor Tr1 which in turn is proportional to Pout, being the output power as supplied by RFout. The relationship typically follows a non-linear relationship as shown by each of the curves 161, 162, 163 and 170.

Curve 161 shows the typical input/output power relationship for an amplifier according to the present invention operating in high bias resistance and low power, low quiescent power mode. Curve 170 shows the corresponding curve for the amplifier operating in low bias resistance and high power, high quiescent current mode. As is clear from FIG. 15, the output power Pout is much greater when the amplifier operates in low bias resistance mode as compared to when it operates in high bias resistance mode, for a given value of input power Pin.

The offset value, being the value of Ic when Pin=0 is the quiescent collector current in transistor Tr1. This is controlled by the value of the applied voltage Vpd or Vm, according to the various embodiments of the invention described above. By setting a higher quiescent current in transistor Tr1, a higher output power can be achieved, at the expense of a shorter battery life between recharging steps. Considering the curves 161, 162 and 163, it is apparent that the gradient of the curve, and hence the amplification for any given input signal power Pout may be varied while retaining a same offset. This may be achieved by varying the current drawn by the current source 26 of FIGS. 2 and 5, by any suitable means. This variation will, of course, affect the absolute potential difference between the base voltages of the emitter follower transistors Tr4*, in turn altering their level of sensitivity to increased input signal power Pin.

Figure 16:
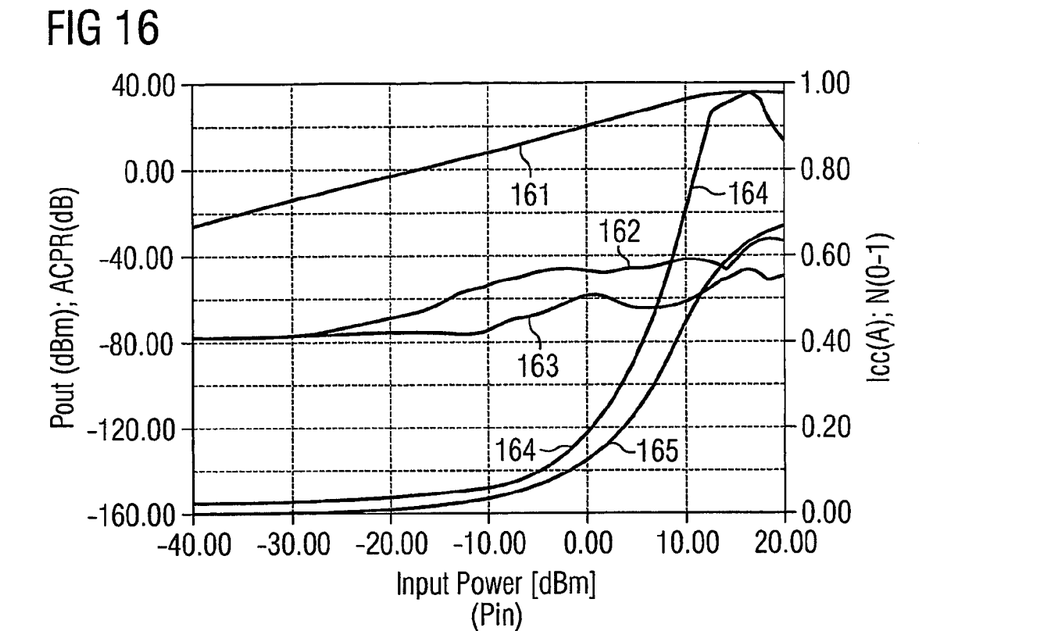
FIGS. 16 and 17 show results of simulations of a circuit according to FIG. 1, in low power mode and high power mode, respectively.
Figure 17:
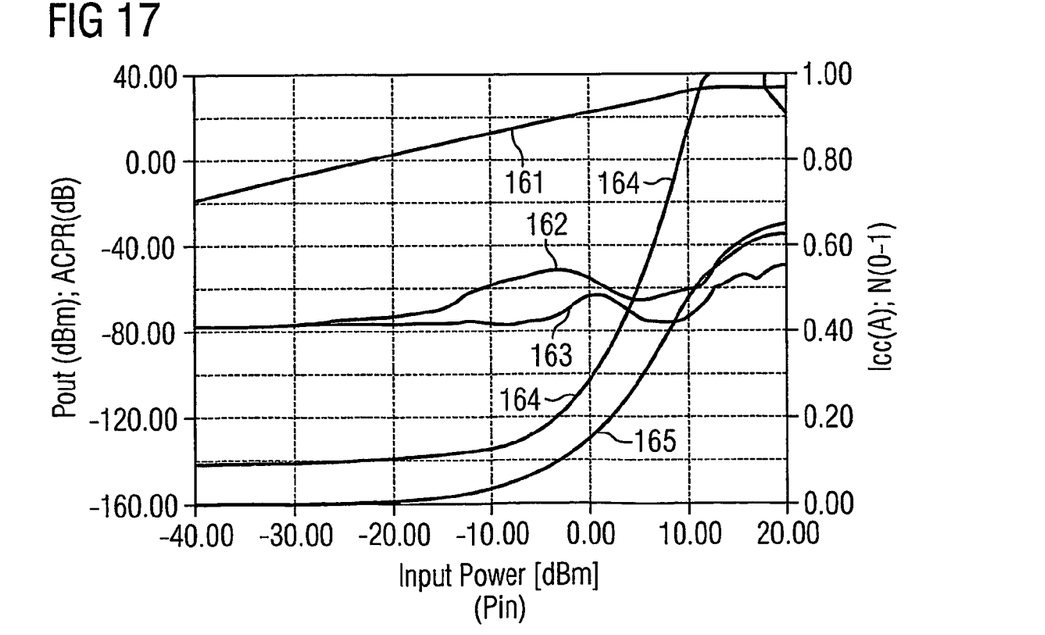

FIGS. 16 and 17 show results of simulations of a circuit according to FIG. 1, in low power mode and high power mode, respectively.

FIG. 16 represents various features of the circuit as functions of input power (Pin), when the circuit of FIG. 1 is operated in low power mode, with the Vmode signal set to 3.0V. Curve 161 is scaled against the left-hand y-axis, and shows output power from the amplifier of FIG. 1. Traces 162 and 163 show adjacent channel power traces for the 1st and 2nd adjacent channels, respectively, scaled against the left-hand y-axis. These parameters indicate how linear the amplifier is. The more negative the number the better.

Curve 164 shows collector current of transistor Tr1, scaled against the right-hand y-axis. Curve 165 is also scaled against the right-hand y-axis, and shows efficiency normalised to a number 0-1 (i.e. 0-100%).

FIG. 17 shows corresponding curves for the amplifier operated in high power mode with the Vmode signal at 0V.

A significant difference is the first adjacent channel 162 green trace is maintained at a lower level (more linear), up to the point that the output power 161 starts to saturate. This improved linearity is achieved due to the circuit operating with a lower bias resistance, and higher quiescent current of around 100 mA, compared to 30 mA in the low power mode. The quiescent current being the flat portion of the Ic (164) curve. Whilst better linearity can be achieved at high power levels, the efficiency of this mode is not so good at low power levels—this demonstrating an advantage of the dual mode of operation on long term battery efficiency.

According to a certain aspect of the present invention, these is provided a bias circuit that changes mode under the influence of RF signal level and/or a control signal (Vmode). These modes may involve changing bias circuit impedances and/or quiescent currents, allowing different tradeoffs between output power, linearity and efficiency to be realised. Certain embodiments of the invention aim to provide a bias impedance that is a function of an input signal level.

While the present invention has been described with reference to a limited number of particular embodiments, many modifications may be made within the scope of the present invention. For example, although various bias circuits have been illustrated and described, any suitable bias circuit could be used which achieves the required effect. While the present invention has been described with exclusive reference to npn transistors, the invention may be transposed for use with pnp transistors, or a mixture of pnp and npn transistors, with appropriate reversal of voltage polarities. The present invention may also be embodied in other types of circuit device, such as JFETs or MOSFETS.

What is claimed is:

1. A method for optimizing power consumption in a transistor amplifier, comprising the step of adapting amplifier characteristics of a transistor (Tr1) of said amplifier, by adapting bias impedance at the base of the transistor, wherein this step comprises,
    providing a bias resistor chain comprising at least two resistors connected to the base of the transistor (Tr1);
    providing at least two emitter follower transistors (Tr4*), each having its emitter connected to a respective node of the bias resistor chain and receiving a respective control voltage at its base; and
    connecting the base of the transistor (Tr1) to a bias supply voltage through at least one of the emitter follower transistors in response to respective control voltages applied to the base of the emitter follower transistors.

2. The method according to claim 1, further comprising the step of adapting the amplifier characteristics of the transistor (Tr1) by adapting quiescent collector current in the transistor (Tr1).

3. A method according to claim 2 wherein:
    the quiescent collector current is controlled by a control loop;
    collector current is mirrored by a current mirror and controlled by reference to current in the current mirror; and
    said step of adapting the quiescent collector current in the transistor comprises artificially adjusting apparent current flowing in the current mirror, thereby causing the control loop to adjust the collector current in the transistor (Tr1) in accordance with the adjusted apparent current flowing in the current mirror.

4. A method according to claim 3 wherein a mode signal is provided, and the apparent current flowing in the current mirror is adjusted in response to the mode signal.

5. A method according to claim 1, wherein:
a mode signal is provided; and
the respective control voltages are adjusted in response to the mode signal.

6. A method according to claim 1, wherein:
a first of said resistors in the bias resistor chain is placed between the base of the transistor (Tr1) and the emitter of an associated first emitter follower;
a second of said at least two resistors in the bias resistor chain is placed between the emitter of the first emitter follower and the emitter of an associated second emitter follower;
the base of the first emitter follower transistor is arranged to receive a bias voltage lower than a bias voltage supplied to the base of the second emitter follower.

7. A method according to claim 1, further comprising the step of AC coupling a signal to be amplified to the base of the transistor (Tr1), whereby the signal to be amplified causes variations in the conductive state of at least one of the emitter followers.

8. A method according to claim 3, wherein the resistor chain is connected between the base of the transistor (Tr1) and a base of the current mirror.

9. An amplifier arranged for optimized power consumption, comprising a transistor (Tr1), a source of signal to be amplified, and bias circuitry, wherein the bias circuitry includes adapting circuitry for adapting the bias impedance at the base of the transistor (Tr1), said adapting circuitry comprising:
a bias resistor chain comprising at least two resistors connected to the base of the transistor Tr1;
at least two emitter follower transistors (Tr4*), each having its emitter connected to a respective node of the bias resistor chain and each connected to receive a respective control voltage at its base;
wherein the emitter follower transistors are connected so as to adjust the bias impedance at the base of the transistor (Tr1) by each adjusting its respective conductivity in response to the respective control voltage.

10. An amplifier according to claim 9, further comprising means for adapting quiescent collector current in the transistor (Tr1).

11. An amplifier according to claim 10 wherein said means for adapting quiescent collector current comprises:
a current mirror arranged to mirror collector current in the transistor (Tr1); and
a control loop responsive to current in the current mirror to adapt the collector current in accordance with the current in the current mirror.

12. An amplifier according to claim 11, wherein the resistor chain is connected between the base of the transistor (Tr1) and a base of the current mirror.

13. An amplifier according to claim 10, further comprising means for artificially adjusting an apparent current flowing in the current mirror, wherein the control loop is arranged to adjust the collector current in the transistor in accordance with adjusted apparent current flowing in the current mirror.

14. An amplifier according to claim 13, wherein a mode signal is provided, and is arranged to artificially adjust the apparent current flowing in the current mirror.

15. An amplifier according to claim 9 wherein:
a mode signal is provide; and
the respective control voltages are arranged to vary in response to the mode signal.

16. An amplifier according to claim 9, further comprising an AC coupling arranged to supply a signal to be amplified to the base of the transistor (Tr1), wherein the at least one emitter follower is arranged such that the signal to be amplified causes variations in the conductive state of the at least one emitter follower.

17. An amplifier according to claim 9, wherein:
a first of said at least two resistors in the bias resistor chain is placed between the base of the transistor (Tr1) and the emitter of an associated first emitter follower transistor;
a second of said at least two resistors in the bias resistor chain is placed between the emitter of the first emitter follower and the emitter of an associated second emitter follower; and
the base of the first emitter follower transistor is arranged to receive a bias voltage lower than a bias voltage supplied to the base of the second emitter follower.

* * * * *